United States Patent [19]

Petr et al.

[11] Patent Number: 4,520,311
[45] Date of Patent: May 28, 1985

[54] CURRENT TO PULSE-SEQUENCE TRANSDUCER

[75] Inventors: Jan Petr, Oberwil; Benedikt Steinle, Zug, both of Switzerland

[73] Assignee: LGZ Landis & Gyr Zug AG, Zug, Switzerland

[21] Appl. No.: 374,797

[22] Filed: May 4, 1982

[30] Foreign Application Priority Data

May 19, 1981 [CH] Switzerland ............... 3259/81

[51] Int. Cl.$^3$ ............... G01R 19/00; G01R 19/26
[52] U.S. Cl. ............... 324/117 R; 324/120; 324/252
[58] Field of Search ............ 324/117 R, 117 H, 127, 324/252, 120, 249; 332/9 R, 9 T

[56] References Cited

U.S. PATENT DOCUMENTS 4,314,200 2/1982 Marek ............... 324/117 R

FOREIGN PATENT DOCUMENTS 1272349 10/1963 Fed. Rep. of Germany .
2112315 9/1972 Fed. Rep. of Germany .
2948762 12/1979 Fed. Rep. of Germany .
3039715 4/1982 Fed. Rep. of Germany .

OTHER PUBLICATIONS

Bajorek et al.; IEEE Transactions on Magnetics, vol. MAG 12; No. 6; Nov. 1976; pp. 813 to 815.

Primary Examiner—Ernest F. Karlsen
Attorney, Agent, or Firm—Ernest F. Marmorek

[57] ABSTRACT

A current to pulse-sequence transducer for transforming a current to be measured into a sequence of pulses which has a certain mark-to-space ratio, includes a first transforming device for transforming the current to be measured into a measurement magnetic field, a second transforming device for generating a reference magnetic field, and magnetic field comparison device including a magnetoresistive thin film comparator normally providing a zero output when the fields are equal, but generating an impulse when the strength of one magnetic field exceeds that of the other, and an impulse processing device. The impulse processing device includes a differentiator amplifier connected to the output of the magnetoresistive thin film comparator and a Schmitt trigger circuit postcoupled to the differentiator amplifier. Thus there will be generated the sequence of pulses which have the mark-to-space ratio in dependence of the current to be measured; this will minimize the influence of any imbalance from the zero output when the fields are equal, and the influence of any external electromagnetic disturbance picked up by the transducer, which has a magnitude below the threshold value of the Schmitt trigger circuit.

8 Claims, 3 Drawing Figures

CURRENT TO PULSE-SEQUENCE TRANSDUCER

BACKGROUND OF THE INVENTION

A current to pulse-sequence transducer for transforming a current to be measured into a sequence of pulses, including means for transforming the current to be measured into a measurement magnetic field having a strength substantially linearly proportional to the current to be measured, means for generating a reference magnetic field, and magnetic field comparison means has already been proposed in Swiss patent application No. 7235/80-1 since published as DE-OS No. 30 39 715; an alternate circuit using magnetoresistive thin films has become known from the publication "IEEE Transactions on Magnetics" Vol. MAG-12, No. 6, November 1976, entitled "A Permalloy Current Sensor", pages 813-815.

Current to pulse-sequence transducers of the aforedescribed kind may, for example, be used as components of a mark-to-space modulator, employed, for example in electricity consumption meters, such as disclosed, for example, in Schneider et al., U.S. Pat. No. 4,291,377, assigned to the assignee of the present invention. In a mark-to-space modulator of this kind, as is known, there is generated a rapid sequence of pulses having a mark-to-space ratio proportional to an input value, for example the value of a current to be measured.

The accuracy of current to pulse-sequence transducers of the aforedescribed kind is, however, influenced by any imbalance, or D.C. offset from a normally zero output when the magnetic fields applied to magnetic field comparison means in the current to pulse-sequence transducer are equal, and is also subject to external electromagnetic disturbances picked up by the transducer.

SUMMARY OF THE INVENTION

It is therefore an object of the present invention to obviate the aforedescribed disadvantages, and in particular to minimize the influence of any imbalance from the zero output when the fields are equal, as well as to minimize the influence of any external electromagnetic disturbance picked up by the transducer.

This object is attained in a current to pulse-sequence transducer for transforming a current to be measured into a sequence of pulses having a certain mark-to-space ratio, which includes means for transforming the current to be measured into a measurement magnetic field having a strength substantially linearly proportional to the current to be measured, means for generating a reference magnetic field, and magnetic field comparison means, including magnetoresistive thin film means normally providing a zero output when the fields are equal, but generating an impulse at a moment in time when the strength of one magnetic field exceeds the strength of the other magnetic field, and including impulse processing means. The impulse processing means, in turn, include a differentiator amplifier connected to the output of the magnetoresistive thin film means, and a Schmitt trigger circuit, which changes its state upon receiving an input having at least a predetermined threshold value, and which is postcoupled to the differentiator amplifier. Thus there will be generated the sequence of impulses having the mark-to-space ratio in dependence of the current to be measured, and any imbalance from the zero output, when the fields are equal, as well as any influence of any external electromagnetic disturbance picked up by the transducer, which has an amplitude below the threshold value on reaching the Schmitt trigger circuit, will be minimized.

Further objects and advantages of the invention will be set forth in part in the following specification and in part will be obvious therefrom without being specifically referred to, the same being realized and attained as pointed out in the claims hereof.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENTS

Figure 1:
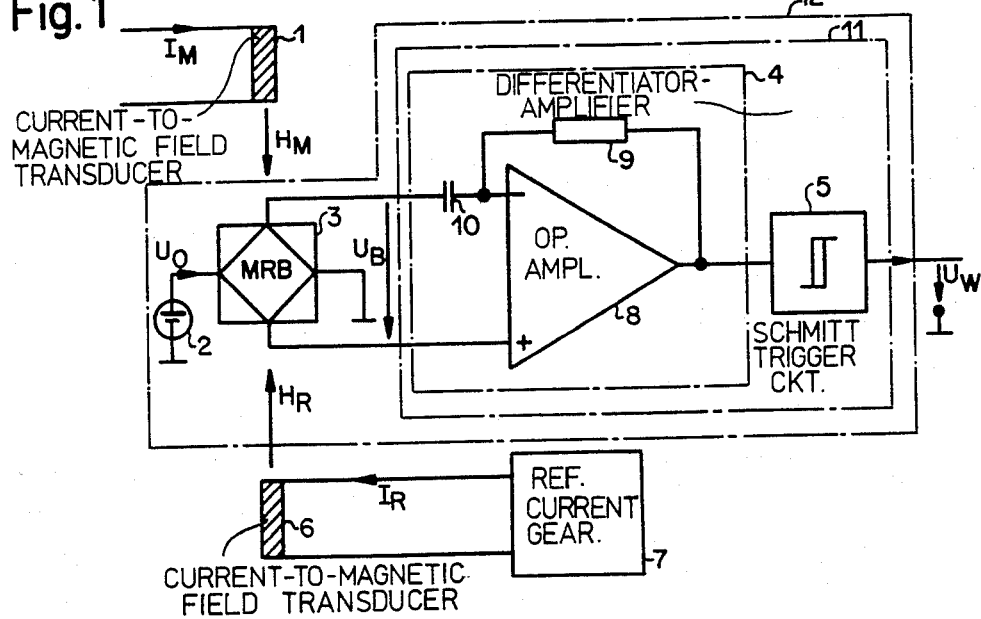
FIG. 1 is a block circuit diagram of a current to pulse-sequence transducer, according to the present invention.

Referring now to the drawings, the current to pulse-sequence transducer, according to the present invention, includes a first current-to-magnetic field transducer 1, a voltage source 2, a magnetoresistive thin film circuit 3, a differentiator amplifier 4, a Schmitt trigger circuit 5, a second current-to-magnetic field transducer 6, and a reference current generator 7. A current $I_M$ is transformed in a first current-to-magnetic field transducer 1 into a magnetic field $H_M$ to be measured, which is proportional to the current; it should be noted that in the aforedescribed circuit there is no need to develop any voltage potential due to the current to be measured across a resistor or the like. A reference circuit generator 7 generates a reference current $I_R$ which may, for example, have a saw-tooth or a triangular waveform as a function of time. The reference current $I_R$ passes through a second current-to-magnetic field transducer 6, which generates a reference magnetic field $H_r$, which in turn is proportional to the reference current $I_R$, and consequently also has a saw-tooth or triangular waveform. In the simplest case both current-to-magnetic field transducers 1 and 6 are electrical conductors, or, as illustrated in FIG. 1, coils free of any iron core. The magnetoresistive thin film circuit 3 consists, in the simplest case, of two magnetoresistive resistors forming a voltage divider. Alternately, it may, as shown in FIG. 1, be implemented by way of a bridge circuit, as disclosed in the prior art, which may in turn consist of four or eight thin films; in the latter case, each of two film pairs are connected in parallel. The abbreviation MRB denotes a "magnetoresistive bridge". The magnetoresistive thin film circuit 3 is spatially arranged so that the measurement magnetic field $H_M$ and the reference magnetic field $H_R$ superimposed thereonto extend parallel to its surface. Both magnetic fields $H_M$ and $H_R$ therefore have parallel field lines near the magnetoresistive thin film circuit 3, which extend near the magnetoresistive thin film circuit 3 in respective opposite directions.

The voltage source 2, one terminal of which is connected to ground, feeds two diametrically opposite terminals of the bridge circuit of the magnetoresistive thin film circuit 3 at a direct current $I_O$. The other diametrically opposite terminals of the bridge circuit supply a balanced bridge output voltage $U_B$ to the balanced input of a differentiator amplifier 4, whose unbalanced output is fed to the input of a Schmitt trigger circuit 5. The unbalanced output of the Schmitt trigger circuit 5 is simultaneously the output of the current to pulse-sequence transducer supplying an output voltage $U_W$.

The differentiator amplifier 4 consists of an operational amplifier 8, whose output is fed back via a feedback resistor 9 to the inverting input of the operational amplifier 8. One terminal of a capacitor 10 is connected to the inverting input of the operational amplifier 8, the other terminal of the capacitor 10, together with the non-inverting input of the operational amplifier 8, forming the input terminal of the differentiator amplifier 4.

The differentiator amplifier 4 and the Schmitt trigger circuit 5 form together impulse processing means 11; the impulse processing means together with the voltage source 2 and the magnetoresistive thin film circuit 3 form a magnetic field comparator 12, which compares both magnetic fields $H_M$ and $H_R$.

OPERATION OF THE CIRCUIT

Figure 2:
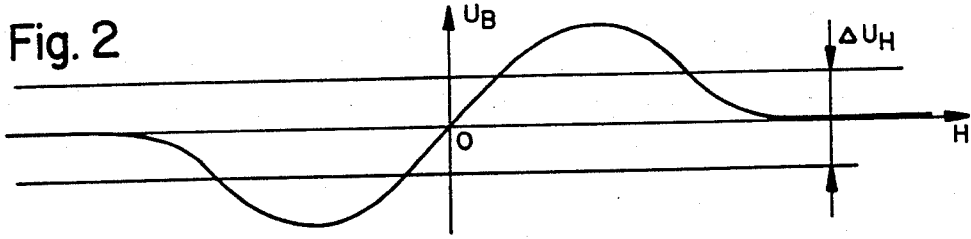
FIG. 2 is a waveform of a typical output pulse generated by the magnetic field comparison means of the current to pulse-sequence transducer, according to the present invention.

The operation of the magnetoresistive thin film circuit 3 is known from the prior art and will therefore not be discussed further. The resulting total magnetic field $H = H_M - H_R$ is applied to the magnetoresistive thin film circuit 3, and generates at its output, if the resulting magnetic field H has a different value from zero, a bridge voltage $U_B$ which, in the ideal case, is equal to zero, but is in practice equal to an offset-voltage $U_{off}$ of the magnetoresistive thin film circuit 3. In the vicinity of the zero crossing of the total magnetic field H, namely in the vicinity where $H_M = H_R$, there appears, as can be ascertained from the prior art, and as is illustrated in an ideal form in FIG. 2, an S-shaped change of the bridge voltage $U_B$, which therefore is superimposed to the (non-illustrated) offset voltage $U_{off}$ in the vicinity of the zero crossing of the total magnetic field H.

Any D.C. bias of the bridge voltage $U_B$, namely primarily the offset D.C. voltage of the magnetoresistive thin film circuit 3, is eliminated with the aid of the capacitor 10, while the alternating part of the output of the bridge is amplified in the differentiator amplifier 4 which receives an input voltage $\mu_{in}$. The output voltage of the differentiator amplifier 4, which can be denoted as K. $dU_B/dt$, where K is a constant K. $dU_B/dt$ is proportional to $dU_{in}/dt$ and thus contains only a single offset voltage, namely the offset voltage of the operational amplifier 8, which is in practice negligible, as the direct amplification of the differentiator amplifier 4 is practically equal to zero.

The output voltage of the differentiator amplifier 4 is subsequently transformed with the aid of the Schmitt trigger circuit 5 into a digital output voltage $U_W$, whose positive-going and negative-going edges coincide at times where $H_M = H_R$ precisely with the zero crossing of the total magnetic field H in the idealized case.

Figure 3:
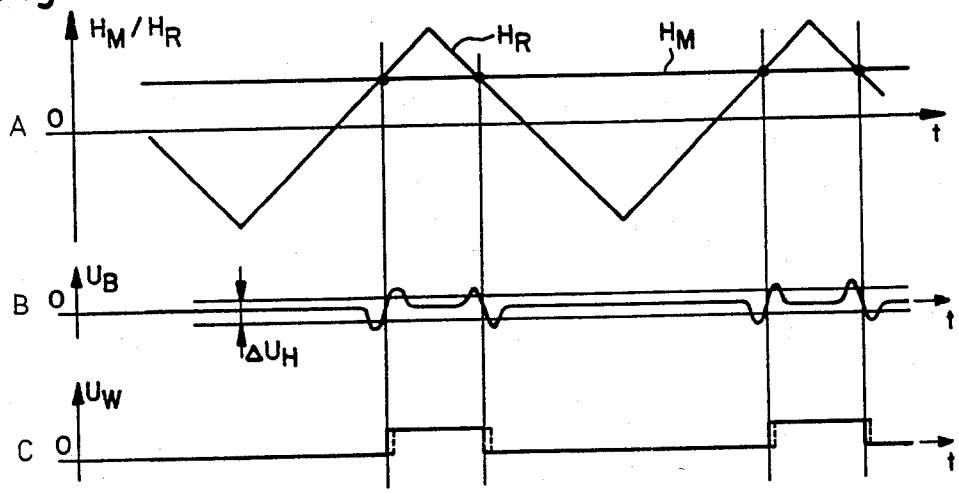
FIG. 3a is a saw-tooth waveform generated by the reference magnetic field generator.
FIG. 3b is a waveform of impulses generated at the output of the magnetoresistive thin film comparison means, according to the present invention.
FIG. 3c is a waveform at the output of the Schmitt trigger circuit, showing the sequence of pulses obtained having a mark-to-space ratio in dependence of the current to be measured.

The parameters ($H_M$, $H_R$), $U_B$ and $U_W$ are illustrated in FIGS. 3a, 3b and 3c, respectively, based on the assumption that the reference current generator 7 generates a saw-tooth, or triangularly-shaped voltage as a function of the time t. The measurement magnetic field $H_M$ is in practice mostly an alternating magnetic field. The frequency of the triangularly-shaped reference magnetic field $H_R$ is chosen, as a rule, to be considerably higher, for an example, at least ten times higher than that of the current $I_M$ to be measured, and consequently that of the measurement magnetic field $H_M$. Thus the measurement magnetic field $H_M$ can be considered approximately constant within a time of approximately two periods of the reference magnetic field $H_R$. Whenever $H_M = H_R$, there appears the aforedescribed sinusoidal voltage change in the waveform of the bridge voltage $U_B$. The phase of the period is dependent on whether the total magnetic field H passes through the zero crossing in one or the other direction, and shows a 180° phase shift therebetween; in other words the phase of the sinusoidal period is dependent on the polarity of the total magnetic field H following the zero crossing, so that the Schmitt trigger circuit 5 can determine the direction of the leading or trailing edges which are generated, based on a predetermined threshold value thereof. An optimal amplification in the differentiator amplifier 4 reduces the demands on the precision of the threshold value. The Schmitt trigger circuit 5 therefore generates, approximately at the time of the zero crossing of the bridge output voltage $U_B$, the digital peak value changes of the output voltage $U_M$ of the current to pulse-sequence transducer in the correct direction. The output voltage $U_W$ therefore consists of a sequence of pulses. As the hysteresis $U_H$ of the Schmitt trigger circuit 5 is symmetrical with respect to the zero point or crossing, although the edges of the output voltage $U_W$ are displaced in time, the mark-to-space ratio of the current to pulse-sequence transducer is not influenced, as both the positive as well as the negative edges are displaced by the same amount, as is shown dotted in FIG. 3.

The use of a Schmitt trigger circuit 5 reduces the sensitivity of the current to pulse-sequence transducer with respect to any offset voltage fluctuations, and minimizes the effect of those external disturbances from electromagnetic radiation, whose amplitudes are smaller than the absolute value of the threshold values of the Schmitt trigger circuit 5.

As none of the circuit elements require high precision performance characteristics, the circuit, according to the present invention, is very suitable for being integral with a substrate, constituting an integrated circuit therewith.

We wish it to be understood that we do not desire to be limited to the exact details of construction shown and described, for obvious modifications will occur to a person skilled in the art.

Having thus described the invention, what we claim as new and desire to be secured by Letters Patent, is as follows:

1. A current to pulse-sequence transducer for transforming an alternating current to be measured into a sequence of pulses having a certain mark-to-space ratio, comprising in combination,
   transforming means for transforming the current to be measured into a measurement magnetic field having a strength substantially linearly proportional to the current to be measured, means for generating an alternating reference magnetic field magnetically coupled to said transforming means, said alternating reference magnetic field having a frequency considerably higher than that of said alternating current, and magnetic field comparison means, including magnetoresistive thin film means magnetically coupled to said transforming means, and normally providing a zero output when said fields are equal, but generating an impulse at a moment in time when the strength of one magnetic field exceeds the strength of the other magnetic field, and impulse processing means, including a differentiator amplifier connected to the output of said magnetoresistive thin film means, and a Schmitt trigger circuit, changing its state upon receiving an input having at least a predetermined threshold value, and postcoupled to said differentiator amplifier, whereby there will be generated said sequence of pulses having said mark-to-space ratio in dependence of said alternating current to be measured, and there will be minimized the influence of any external electromagnetic disturbance picked up by said transducer having a magnitude below said threshold value on reaching said Schmitt trigger circuit.

2. A current to pulse-sequence transducer as claimed in claim 1, wherein said differentiator amplifier includes an operational amplifier having an inverting input, a feedback resistor connected between the output of said operational amplifier and said inverting input, and a capacitor connected with one terminal thereof to said inverting input, the other terminal of said capacitor being an input terminal of said differentiator amplifier.

3. A current to pulse-sequence transducer as claimed in claim 1, wherein said means for generating a reference magnetic field includes a generator generating a reference current.

4. A current to pulse-sequence transducer as claimed in claim 1, wherein said reference magnetic field has a saw-tooth waveshape.

5. A current to pulse-sequence transducer as claimed in claim 1, wherein said means for generating a reference magnetic field includes a generator generating a saw-tooth current waveform or voltage waveform.

6. A current to pulse-sequence transducer as claimed in claim 1, wherein said current to be measured is an alternating current having a predetermined frequency, and said reference magnetic field has a prearranged frequency at least ten times that of said predetermined frequency.

7. A current to pulse-sequence transducer as claimed in claim 1, wherein all of said means are integral with a substrate and/or constitute an integrated circuit.

8. An apparatus for measuring power delivered at an alternating voltage by an alternating current to a load comprising in combination:

sampling means for periodically sampling the alternating voltage delivered to the load at a set of selected first sampling points, first converter means connected to said sampling means, and including impulse generator means, for converting the first sampled points to a first sequence of a plurality of pulses, the number of pulses in said first sequence being substantially proportional to the instantaneous values of the alternating voltage, alternating current converter means including, generating means for generating an alternating reference magnetic field having a frequency at least ten times that of said alternating voltage, and magnetic field comparison means magnetically coupled to said generating means, and including magnetoresistive thin film means normally providing a zero output when said fields are equal, but generating an impulse at a moment in time when the strength of one magnetic field exceeds the strength of the other magnetic field, and impulse processing means, including a differentiator amplifier connected to the output of said magnetoresistive thin film means, and a Schmitt trigger circuit, changing its state upon receiving an input having at least a predetermined threshold value, postcoupled to said differentiator amplifier, and generating a periodicity of pulses having a mark-to-space ratio in dependence of said alternating current to be measured, the peak values of said periodicity of pulses defining a set of selected second sampling points, second converter means connected to said Schmitt trigger circuit and to said impulse generator means for converting the second sampled points to a second sequence of plurality of pulses, the number of pulses in said second sequence being substantially proportional to the instantaneous values of the alternating current, first counting means for counting the first sequence if pulses, second counting means for counting the second sequence of pulses, averaging means for determining the average value of said first and second sequence of pulses, respectively, over at least one period of the alternating current, subtractor means for obtaining difference values between said average value, and said first and second sequence of pulses, respectively, multiplier means for multiplying said respective difference values, to obtain successive product values, and integrating means for integrating said successive product values over said at least one period so as to measure the power delivered to said load, whereby any error in determining said average value is eliminated from the power measurement.

* * * * *